United States Patent
Krystad et al.

(10) Patent No.: US 9,889,454 B2
(45) Date of Patent: Feb. 13, 2018

(54) FLUID DISCHARGE DEVICE

(71) Applicant: MPI Corporation, Hsinchu County (TW)

(72) Inventors: Helge Jacob Krystad, Hsinchu County (TW); Yueh-Ying Lee, Hsinchu County (TW); Ying-Chiao Chang, Hsinchu County (TW)

(73) Assignee: MPI Corporation, Hsinchu County (TW)

( * ) Notice: Subject to any disclaimer, the term of this patent is extended or adjusted under 35 U.S.C. 154(b) by 107 days.

(21) Appl. No.: 14/745,480

(22) Filed: Jun. 22, 2015

(65) Prior Publication Data

US 2016/0131411 A1    May 12, 2016

(30) Foreign Application Priority Data

Nov. 6, 2014    (TW) .............................. 103138565 A

(51) Int. Cl.
*B05B 7/16* (2006.01)
*B05B 7/08* (2006.01)
*G01R 31/28* (2006.01)

(52) U.S. Cl.
CPC .............. *B05B 7/16* (2013.01); *B05B 7/0815* (2013.01); *G01R 31/2877* (2013.01)

(58) Field of Classification Search
CPC ..... F25D 13/067; G01R 31/2877; B05B 7/16; B05B 7/0815
USPC ............................................................ 62/82
See application file for complete search history.

(56) References Cited

U.S. PATENT DOCUMENTS

| | | | | |
|---|---|---|---|---|
| 2,149,990 A | * | 3/1939 | Cook .................... | F24F 3/1417 165/301 |
| 2,202,360 A | * | 5/1940 | Ullstrand .............. | F25B 47/027 137/335 |
| 2,526,032 A | * | 10/1950 | La Porte ................. | F25D 21/12 62/275 |
| 3,094,851 A | * | 6/1963 | Beckwith .............. | A47F 3/0447 454/193 |
| 4,207,747 A | * | 6/1980 | Subera .................. | F25D 21/125 62/82 |
| 4,423,601 A | * | 1/1984 | Kramer ................... | F25D 21/10 62/282 |

(Continued)

FOREIGN PATENT DOCUMENTS

CN        101842629 A        9/2010

OTHER PUBLICATIONS

Taiwan Office Action that the art reference was cited on Jun. 27, 2016.
English Translation of Taiwan Office Action dated Jun. 27, 2016.

*Primary Examiner* — Umashankar Venkatesan
(74) *Attorney, Agent, or Firm* — CKC & Partners Co., Ltd.

(57) ABSTRACT

A fluid discharge device includes a discharge tube, an outer tube and at least one baffle. The discharge tube has a discharge port. The discharge tube has an end surface adjacent to the discharge port. The outer tube is sleeved outside the discharge tube. The outer tube has at least one passage. The passage is configured to flow a clean dry air. The passage has an outlet. The baffle is disposed outside the outlet. When the clean dry air passes through the outlet, at least part of the clean dry air is blocked by the baffle and is directed to the end surface of the discharge tube.

12 Claims, 6 Drawing Sheets

(56) References Cited

U.S. PATENT DOCUMENTS

| | | | | |
|---|---|---|---|---|
| 6,267,301 B1* | 7/2001 | Haruch | ............... | B05B 7/0458 239/290 |
| 8,978,396 B2* | 3/2015 | Ellis | ..................... | F28D 7/10 62/272 |
| 2010/0275620 A1* | 11/2010 | Zurecki | ................. | B21B 27/10 62/80 |
| 2014/0158206 A1* | 6/2014 | Ellis | ..................... | F04B 37/08 137/1 |

* cited by examiner

FLUID DISCHARGE DEVICE

RELATED APPLICATIONS

This application claims priority to Taiwan Application Serial Number 103138565, filed Nov. 6, 2014, which is herein incorporated by reference.

BACKGROUND

Technical Field

The present disclosure relates to fluid discharge devices. More particularly, the present disclosure relates to gas discharge devices.

Description of Related Art

When a testing environment of a stable temperature is to be established in testing equipment, especially in a low-temperature environment below zero Celsius, one of the approaches is that a low-temperature fluid is continuously supplied to this testing equipment. Naturally, this type of testing equipment requires a fluid discharge device, so as to discharge the used low-temperature fluid into the atmosphere. Thus, the temperature in the testing equipment can be maintained, and the pressure in the testing equipment will not increase.

Traditionally, in order to prevent the discharged low-temperature fluid from causing the phenomenon of frosting and condensation near the discharge port, clean dry air (CDA) is generally used to prevent the condensation of moisture near the low-temperature discharge port. To be more specific, in a traditional approach, discharge ports of clean dry air are distributed around the discharge port of the low-temperature fluid. However, since the discharging direction of clean dry air is the same as the discharging direction of the low-temperature fluid, the clean dry air has difficulty forming a protective air layer effectively at the low-temperature hardware interface near the discharge port of the low-temperature fluid. As a result, if the flow volume of the clean dry air is too small, there will be difficulty preventing the condensation of moisture on the low-temperature hardware interface. Thus, the phenomenon of frosting and condensation will appear near the discharge port of the low-temperature fluid. On the other hand, if the flow volume of the clean dry air is increased, most of the clean dry air will be substantially discharged directly into the atmosphere and wasted. This depletion of a large volume of clean dry air will thus lead to an increase of the operating cost.

For the sake of controlling the operating cost, the method to reduce the volume use of clean dry air while effectively preventing the phenomenon of frosting and condensation is undoubtedly an important direction for the development of fluid discharge devices.

SUMMARY

A technical aspect of the present disclosure provides a fluid discharge device which can block and turn the clean dry air (CDA), such that the clean dry air can effectively pass the low-temperature hardware interface near the discharge port of the low-temperature fluid in contact with the air of a high temperature (room temperature). Apart from effectively reducing the volume use of the clean dry air and the noise generated during operation, the phenomenon of frosting and condensation on the hardware interface near the discharge port is effectively prevented during the discharge of the low-temperature fluid.

According to an embodiment of the present disclosure, a fluid discharge device includes a discharge tube, an outer tube and at least one baffle. The discharge tube has a discharge port. The discharge tube has an end surface. The end surface is adjacent to the discharge port. The outer tube is sleeved outside the discharge tube. The outer tube has at least one passage. The passage is configured to flow clean dry air. The passage has an outlet. The baffle is disposed outside the outlet. When the clean dry air passes through the outlet, at least part of the clean dry air is blocked by the baffle and is directed to the end surface of the discharge tube.

In one or more embodiments of the present disclosure, the baffle has an outer surface facing away from the passage and a plurality of air holes communicating with the outer surface. After the clean dry air passes through the outlet, at least part of the clean dry air passes through the air holes, and forms an air layer on the outer surface.

In one or more embodiments of the present disclosure, the air holes are distributed on the outer surface in a plane distribution manner.

In one or more embodiments of the present disclosure, as viewed from a direction perpendicular to the outer surface, each of the air holes has a hole area and the outer surface has a surface area. The sum of the hole areas is less than ⅓ of the surface area.

In one or more embodiments of the present disclosure, the air holes are arranged in a plurality of annuluses on the outer surface.

In one or more embodiments of the present disclosure, a hole diameter of each of the air holes is from about 0.1 mm to 0.5 mm.

In one or more embodiments of the present disclosure, the baffle is a porous material.

In one or more embodiments of the present disclosure, the baffle is metallic in nature.

In one or more embodiments of the present disclosure, the fluid discharge device further includes a heat source. The heat source is configured to heat up the clean dry air.

In one or more embodiments of the present disclosure, the outer tube includes a discharge port holder and a discharge port piece. The discharge port holder is configured to be fixed upon testing equipment. The discharge port piece is mutually locked up with the discharge port holder by a screwing method.

In one or more embodiments of the present disclosure, the discharge tube has an outer wall facing the passage. A chamfer is formed between the outer wall and the end surface.

In one or more embodiments of the present disclosure, the discharge tube has an outer wall facing the passage. A fillet is formed between the outer wall and the end surface.

In one or more embodiments of the present disclosure, the fluid discharge device further includes a partition plate. The partition plate is located at the outlet of the passage. The partition plate and the outer tube have a gap in between. The outlet of the passage is limited in the gap. After the clean dry air passes through the gap, at least part of the clean dry air is blocked by the baffle and is directed to an outer surface of the partition plate facing away from the passage, so as to form an air layer on the outer surface.

When compared with the prior art, the embodiments of the present disclosure mentioned above have at least the following advantages:

(1) When the clean dry air passes through the outlet, at least part of the clean dry air is blocked by the baffle and is directed to the end surface of the discharge tube, such that the end surface is protected by the clean dry air. Therefore, apart from effectively reducing the volume use of the clean dry air, the phenomenon of frosting and condensation of the moisture on the end surface is effectively prevented.

(2) Since the air layer on the outer surface of the baffle is formed by the clean dry air passing through a plurality of small air holes, the volume use of the clean dry air is effectively reduced.

(3) Since the volume use of the clean dry air is reduced, the noise produced when the clean dry air passing through the air holes is also effectively reduced.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
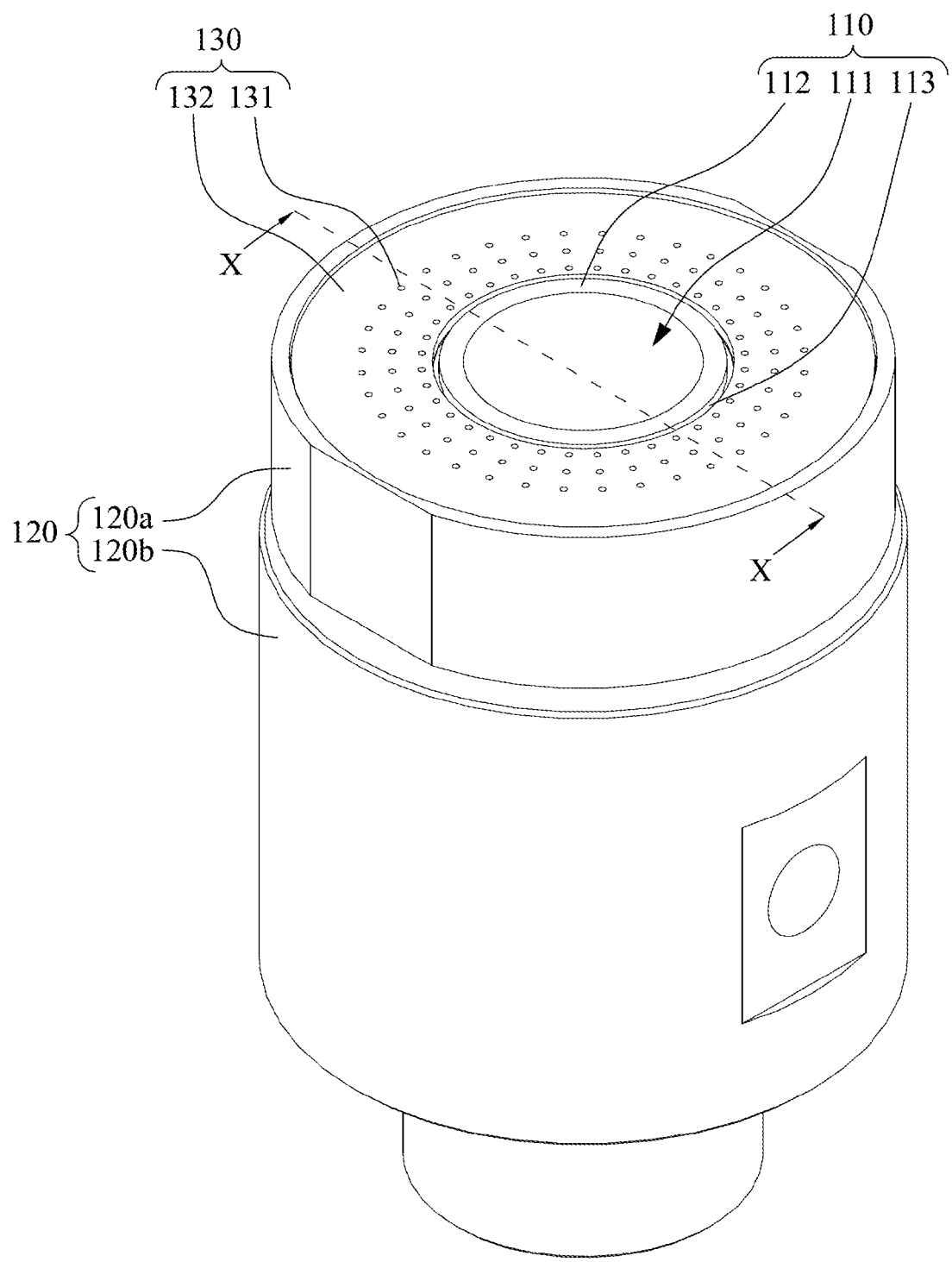
FIG. 1 is a perspective view of a fluid discharge device according to an embodiment of the present disclosure.

Drawings will be used below to disclose a plurality of embodiments of the present disclosure. For the sake of clear illustration, many practical details will be explained together in the description below. However, it is appreciated that the practical details should not be used to limit the claimed scope. In other words, in some embodiments of the present disclosure, the practical details are not essential. Moreover, for the sake of drawing simplification, some customary structures and elements in the drawings will be schematically shown in a simplified way. Wherever possible, the same reference numbers are used in the drawings and the description to refer to the same or like parts.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
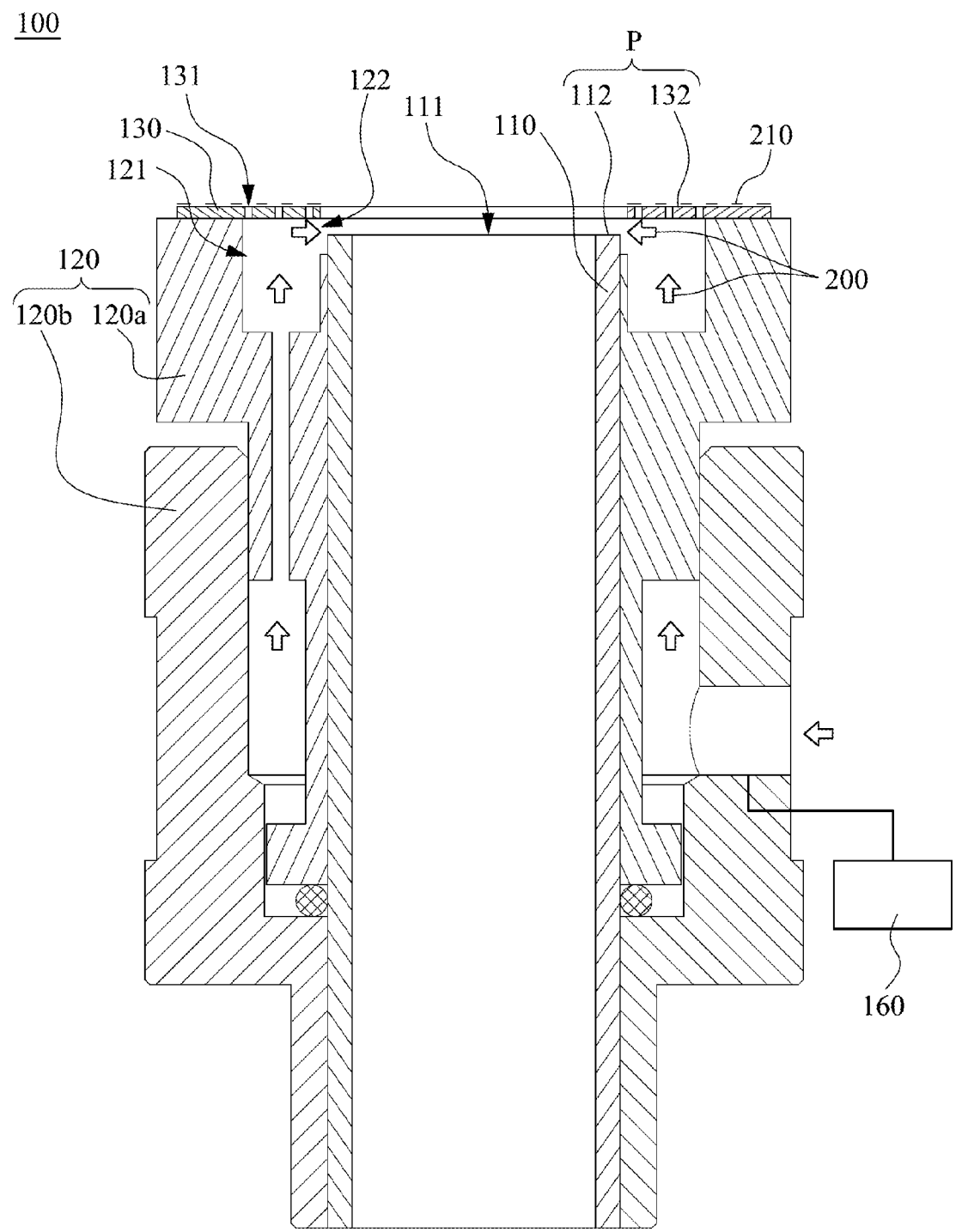
FIG. 2 is a sectional view along the section line X of FIG. 1.

Please refer to FIGS. 1-2. FIG. 1 is a perspective view of a fluid discharge device 100 according to an embodiment of the present disclosure. FIG. 2 is a sectional view along the section line X of FIG. 1. As shown in FIGS. 1-2, a fluid discharge device 100 includes a discharge tube 110, an outer tube 120 and at least one baffle 130. The discharge tube 110 has a discharge port 111. The discharge tube 110 has an end surface 112. The end surface 112 is adjacent to the discharge port 111. The outer tube 120 is sleeved outside the discharge tube 110. The outer tube 120 has at least one passage 121. The passage 121 is configured to flow clean dry air (CDA) 200. The passage 121 has an outlet 122. The baffle 130 is disposed outside the outlet 122. When the clean dry air 200 passes through the outlet 122, at least part of the clean dry air 200 is blocked by the baffle 130 and is directed to the end surface 112 of the discharge tube 110.

In the practical applications, the fluid discharge device 100 can be applied to testing equipment (not shown in the Figs.) which maintains a specific environmental temperature. For example, in a low-temperature testing environment below zero, in order to maintain the testing environment at a low temperature, a low-temperature fluid is continuously introduced into this testing equipment. The used low-temperature fluid is discharged from this testing equipment through the fluid discharge device 100 into the atmosphere. However, the temperature of the used low-temperature fluid is still in a low level, for instance −80° C. Therefore, the surface near to the discharge port 111 of the discharge tube 110 becomes a low-temperature hardware interface probably in contact with the air of a high temperature (room temperature). This low-temperature hardware interface includes the end surface 112 of the discharge tube 110. As a result, in order to prevent the condensation of moisture on the low-temperature end surface 112, when the clean dry air 200 passes through the outlet 122, at least part of the clean dry air 200 is blocked by the baffle 130 and is directed to the end surface 112 of the discharge tube 110. Consequently, the low-temperature end surface 112 is protected by the clean dry air 200. By the blocking and turning of the baffle 130 against the clean dry air 200, apart from effectively reducing the volume use of the clean dry air 200, the phenomenon of frosting and condensation on the end surface 112 due to the contact of moisture to the low-temperature end surface 112 is effectively prevented.

On the other hand, since the baffle 130 is also located near the discharge port 111 of the discharge tube 110, the outer surface 132 of the baffle 130 also becomes a low-temperature hardware interface probably in contact with the air of a high temperature (room temperature). As mentioned above, both the end surface 112 of the discharge tube 110 and the outer surface 132 of the baffle 130 are low-temperature hardware interfaces, together forming a protected interface P. In other words, once the protected interface P is protected by the clean dry air 200, the moisture in the air cannot contact the protected interface P (including the end surface 112 and the outer surface 132) and thus will not frost or condense on the protected interface P. Therefore, apart from the protection of the low-temperature end surface 112 by the clean dry air 200 as mentioned above, in order to prevent the moisture from condensing on the low-temperature baffle 130, in this embodiment, as shown in FIG. 2, the baffle 130 has the outer surface 132. The outer surface 132 is located on a side of the baffle 130 facing away from the passage 121. The baffle 130 further has a plurality of air holes 131 communicating with the outer surface 132. After the clean dry air 200 passes through the outlet 122, at least part of the clean dry air 200 passes through the air holes 131 and forms an air layer 210 on the outer surface 132. In this way, the baffle 130 is protected by the clean dry air 200, and the phenomenon of frosting and condensation of the moisture on the low-temperature outer surface 132 of the baffle 130 is prevented.

Please refer to FIG. 1. As mentioned above, the baffle 130 has the outer surface 132. The outer surface 132 is located on a side of the baffle 130 facing away from the passage 121. In this embodiment, the air holes 131 are distributed on the outer surface 132 in a plane distribution manner. In other words, the air holes 131 are distributed on the outer surface 132 in at least two directions with an angle in between larger than zero. Thus, the air holes 131 can substantially cover a plane, while not limited to only a linear distribution along a straight line.

Moreover, as shown in FIG. 1, the air holes 131 are arranged in a plurality of annuluses on the outer surface 132. In this embodiment, the air holes 131 are arranged in three annuluses. It is noted that the arrangement pattern of the air holes 131 as cited herein are only illustrative and are not to limit the claimed scope. A person having ordinary skill in the art of the present invention may appropriately design the arrangement pattern of the air holes 131 depending on the actual needs.

To be more specific, as viewed from a direction perpendicular to the outer surface 132, each of the air holes 131 has a hole area, and the outer surface 132 has a surface area. In order to achieve the optimum effect for the formation of the air layer 210 on the outer surface 132, the sum of the hole areas of the air holes 131 is less than ⅓ of the surface area of the outer surface 132. In this embodiment, the hole diameter of each of the air holes 131 is from about 0.1 mm to 0.5 mm. However, this dimension does not intend to limit the scope of the present disclosure. In other embodiments, the baffle 130 can be a porous material.

In addition, since the air layer 210 on the outer surface 132 of the baffle 130 is formed by the clean dry air 200 passing through a plurality of small air holes 131, the volume use of the clean dry air 200 is effectively reduced, and thus the operating cost is also effectively reduced. Moreover, since the volume use of the clean dry air 200 is reduced, the noise produced when the clean dry air 200 passing through the air holes 131 is also effectively reduced.

On the other hand, in order to further prevent the phenomenon of frosting and condensation of moisture on the baffle 130, as shown in FIG. 2, the fluid discharge device 100 further includes a heat source 160. The heat source 160 is configured to heat up the clean dry air 200, such that the temperature of the clean dry air 200 flowing through the passage 121 can be increased. Apart from contributing to the prevention of condensation of moisture on the baffle 130, this can further reduce the volume use of the clean dry air 200, and thus the operating cost is further reduced.

Furthermore, in order to work with the heated clean dry air 200, the baffle 130 can be metallic in nature. Thus, the temperature of the baffle 130 can be easily raised with the heated clean dry air 200, and the prevention of the phenomenon of frosting and condensation of the moisture on the baffle 130 can be further enhanced.

In this embodiment, as shown in FIG. 2, the outer tube 120 includes a discharge port piece 120a and a discharge port holder 120b. The discharge port holder 120b is configured to be fixed upon a housing of testing equipment (not shown in the Figs.). For the sake of easy installation, the discharge port piece 120a is mutually locked up with the discharge port holder 120b by a screwing method.

Figure 3:
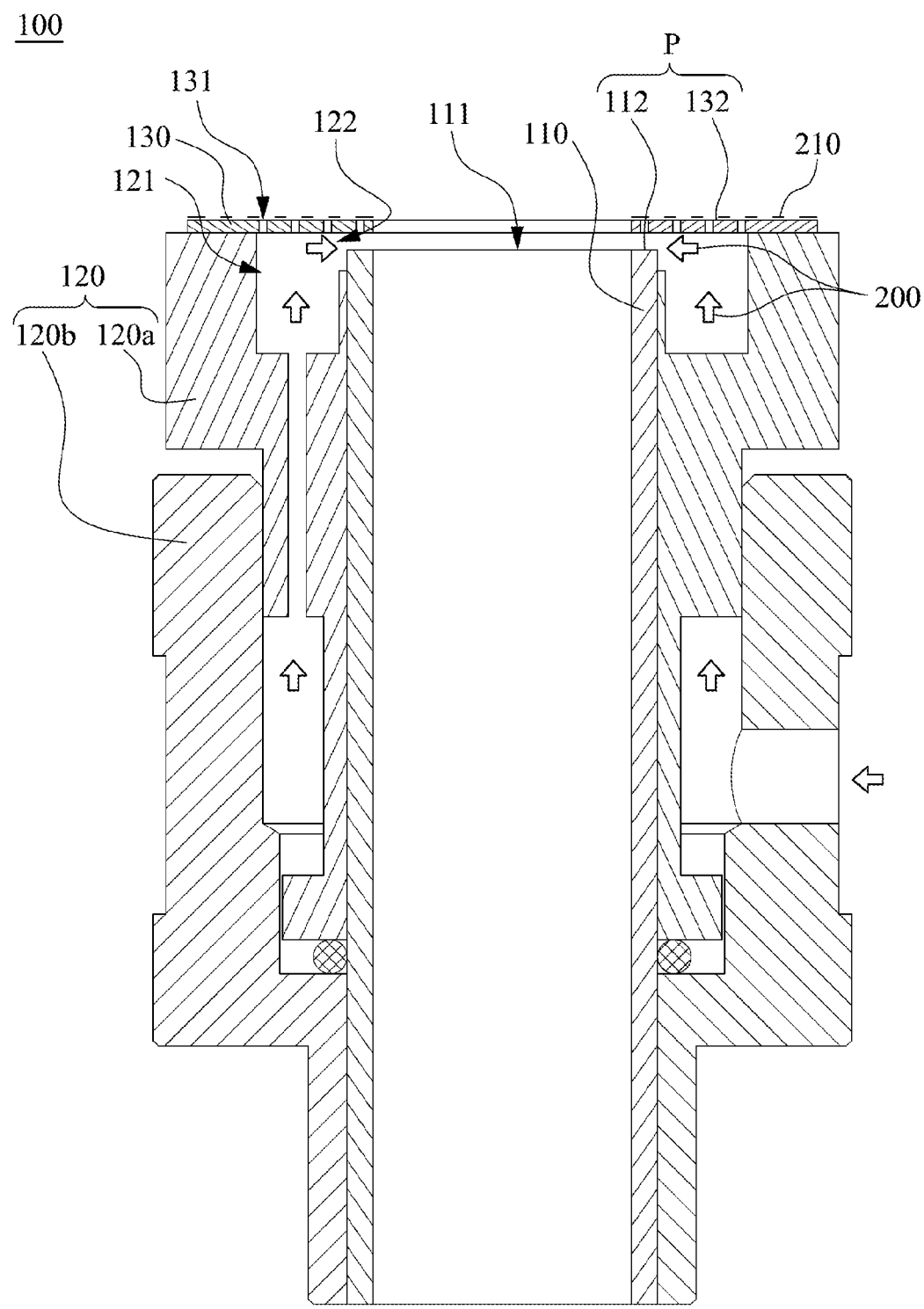
FIG. 3 is a sectional view of a fluid discharge device according to another embodiment of the present disclosure.

Please refer to FIG. 3. FIG. 3 is a sectional view of a fluid discharge device 100 according to another embodiment of the present disclosure. As shown in FIG. 3, the baffle 130 can extend towards the discharge port 111, such that the inner edge of the baffle 130 aligns with the discharge port 111.

Figure 4:
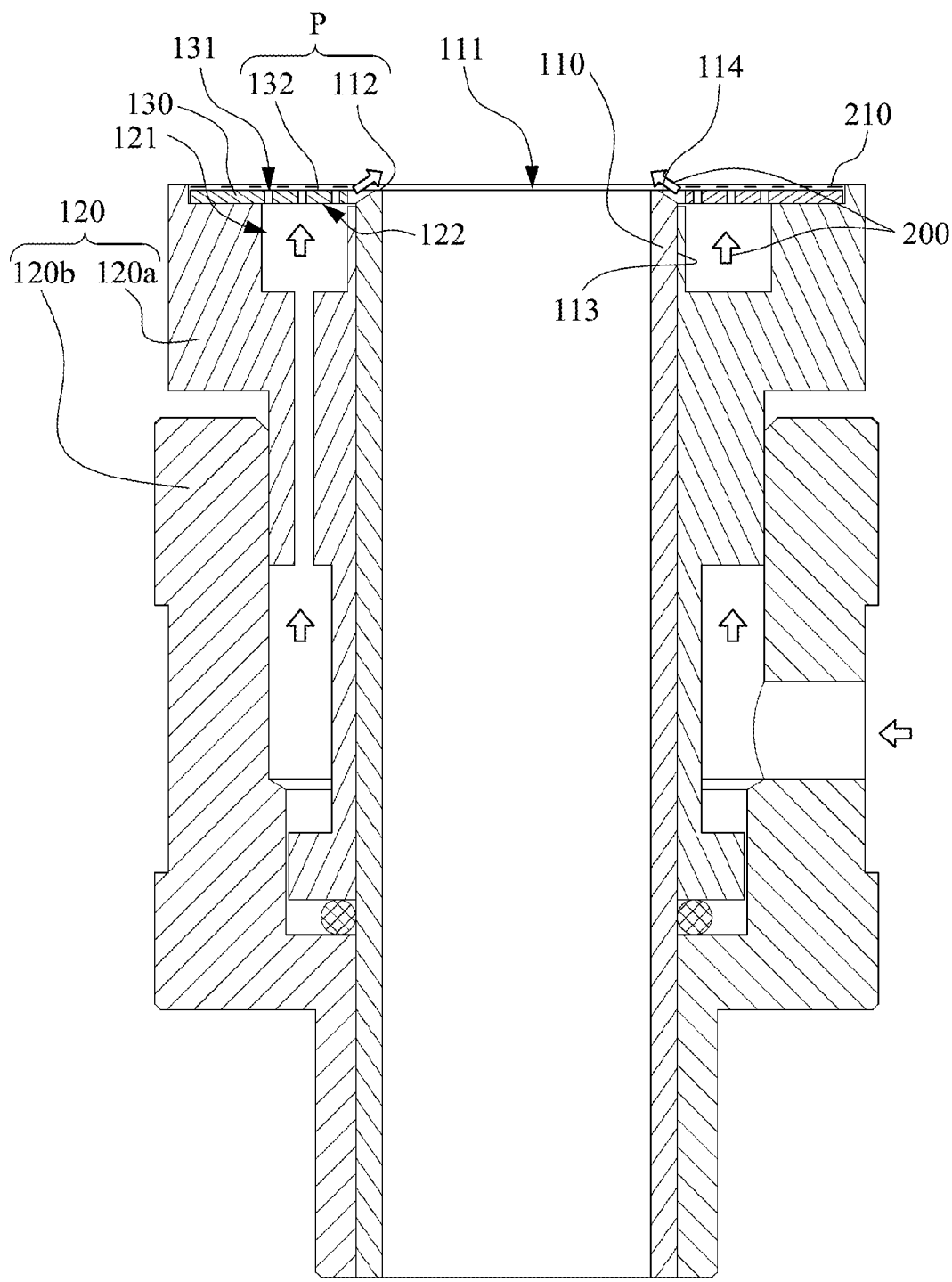
FIG. 4 is a sectional view of a fluid discharge device according to a further embodiment of the present disclosure.

Please refer to FIG. 4. FIG. 4 is a sectional view of a fluid discharge device 100 according to a further embodiment of the present disclosure. As shown in FIG. 4, the end surface 112 of the discharge tube 110 and the outer surface 132 of the baffle 130 locate substantially in the same horizontal level. In order to allow the clean dry air 200 to flow towards the end surface 112, the discharge tube 110 has an outer wall 113 facing the passage 121. A chamfer 114 is formed between the outer wall 113 and the end surface 112, such that the clean dry air 200 can be guided to flow towards the end surface 112.

Figure 5:
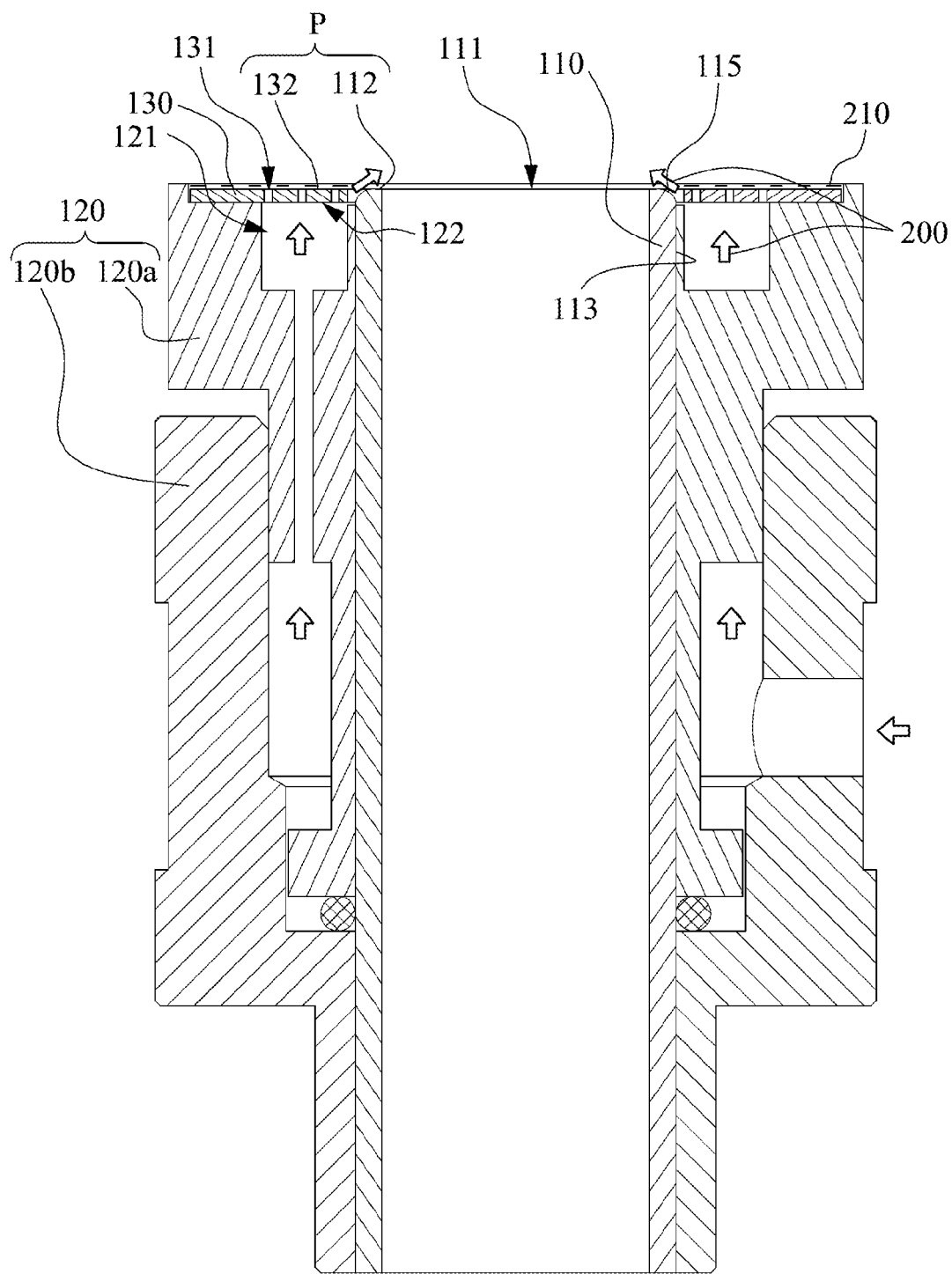
FIG. 5 is a sectional view of a fluid discharge device according to a further embodiment of the present disclosure.

Please refer to FIG. 5. FIG. 5 is a sectional view of a fluid discharge device 100 according to a further embodiment of the present disclosure. Similarly, as shown in FIG. 5, the end surface 112 of the discharge tube 110 and the outer surface 132 of the baffle 130 locate substantially in the same horizontal level. In order to allow the clean dry air 200 to flow towards the end surface 112, a fillet 115 is formed between the outer wall 113 and the end surface 112, such that the clean dry air 200 can be guided to flow towards the end surface 112.

Figure 6:
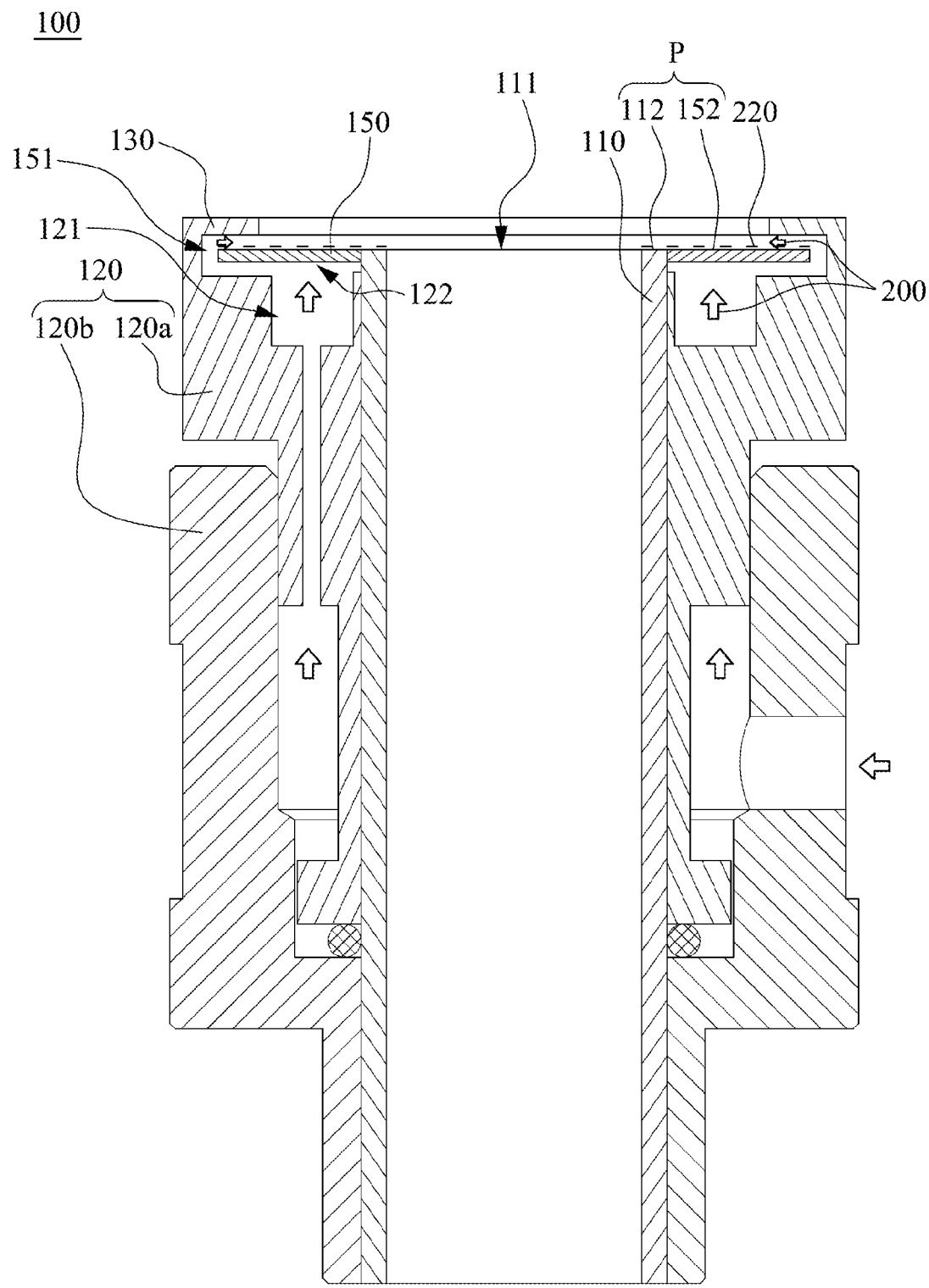
FIG. 6 is a sectional view of a fluid discharge device according to a further embodiment of the present disclosure.

Please refer to FIG. 6. FIG. 6 is a sectional view of a fluid discharge device 100 according to a further embodiment of the present disclosure. As shown in FIG. 6, the fluid discharge device 100 further includes a partition plate 150. The partition plate 150 is located at the outlet 122 of the passage 121. The partition plate 150 and the outer tube 120 have a gap 151 in between. The outlet 122 of the passage 121 is limited in the gap 151. In this embodiment, the end surface 112 of the discharge tube 110 and the outer surface 152 of the partition plate 150 facing away from the passage 121 form together the protected interface P. After the clean dry air 200 passes through the gap 151, at least part of the clean dry air 200 is blocked by the baffle 130 and is directed to the protected interface P, i.e., the outer surface 152 of the partition plate 150 and the end surface 112. An air layer 220 is formed on the protected interface P, so as to prevent the phenomenon of frosting and condensation of moisture on the protected interface P.

In summary, when compared with the prior art, the embodiments of the present disclosure mentioned above have at least the following advantages:

(1) When the clean dry air passes through the outlet, at least part of the clean dry air is blocked by the baffle and is directed to the end surface of the discharge tube, such that the end surface is protected by the clean dry air. Therefore, apart from effectively reducing the volume use of the clean dry air, the phenomenon of frosting and condensation of the moisture on the end surface is effectively prevented.

(2) Since the air layer on the outer surface of the baffle is formed by the clean dry air passing through a plurality of small air holes, the volume use of the clean dry air is effectively reduced.

(3) Since the volume use of the clean dry air is reduced, the noise produced when the clean dry air passing through the air holes is also effectively reduced.

Although the present disclosure has been described in considerable detail with reference to certain embodiments thereof, other embodiments are possible. Therefore, the spirit and scope of the appended claims should not be limited to the description of the embodiments contained herein.

It will be apparent to the person having ordinary skill in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:
1. A fluid discharge device, comprising:
a discharge tube having a discharge port, the discharge tube having an end surface adjacent to the discharge port;

an outer tube sleeved outside the discharge tube, the outer tube having at least one passage, the passage being configured to flow a clean dry air, the passage having an outlet; and at least one baffle disposed near to the end surface, the baffle being at least partially overlapped with the outlet along an extension direction of at least a portion of the outer tube connected with the baffle, such that when the clean dry air passes through the outlet, at least a part of the clean dry air is blocked by the baffle and is directed to the end surface of the discharge tube;

wherein the baffle has an outer surface facing away from the passage and a plurality of air holes penetrating through the outer surface, at least another part of the clean dry air passes through the air holes, and forms an air layer on the outer surface.

2. The fluid discharge device of claim 1, wherein the air holes are distributed on the outer surface in a plane distribution manner.

3. The fluid discharge device of claim 2, wherein as viewed from a direction perpendicular to the outer surface, each of the air holes has a hole area, the outer surface has a surface area, and the sum of the hole areas is less than ⅓ of the surface area.

4. The fluid discharge device of claim 1, wherein the air holes are arranged in a plurality of annuluses on the outer surface.

5. The fluid discharge device of claim 1, wherein a hole diameter of each of the air holes is from about 0.1 mm to 0.5 mm.

6. The fluid discharge device of claim 1, wherein the baffle is a porous material.

7. The fluid discharge device of claim 1, wherein the baffle is metallic in nature.

8. The fluid discharge device of claim 1, further comprising a heat source configured to heat up the clean dry air.

9. The fluid discharge device of claim 1, wherein the outer tube comprises:

a discharge port holder configured to be fixed upon a testing equipment; and a discharge port piece mutually locked up with the discharge port holder by a screwing method.

10. The fluid discharge device of claim 1, wherein the discharge tube has an outer wall facing the passage, and a chamfer is formed between the outer wall and the end surface.

11. The fluid discharge device of claim 1, wherein the discharge tube has an outer wall facing the passage, and a fillet is formed between the outer wall and the end surface.

12. The fluid discharge device of claim 1, further comprising:

a partition plate located at the outlet of the passage, the partition plate and the outer tube having a gap in between, such that the outlet of the passage is limited in the gap, after the clean dry air passes through the gap, at least part of the clean dry air is blocked by the baffle and is directed to an outer surface of the partition plate facing away from the passage, so as to form an air layer on the outer surface.

\* \* \* \* \*